(12) United States Patent
Kollipara et al.

(10) Patent No.: US 7,027,307 B2
(45) Date of Patent: Apr. 11, 2006

(54) CLOCK ROUTING IN MULTIPLE CHANNEL MODULES AND BUS SYSTEMS

(75) Inventors: Ravindranath T. Kollipara, Fremont, CA (US); David Nguyen, San Jose, CA (US); Belgacem Haba, Cupertino, CA (US)

(73) Assignee: Rambus Inc., Los Altos, CA (US)

( * ) Notice: Subject to any disclaimer, the term of this patent is extended or adjusted under 35 U.S.C. 154(b) by 161 days.

(21) Appl. No.: 10/420,308

(22) Filed: Apr. 22, 2003

(65) Prior Publication Data

US 2004/0066636 A1 Apr. 8, 2004

Related U.S. Application Data

(60) Division of application No. 09/817,828, filed on Mar. 26, 2001, now Pat. No. 6,590,781, which is a continuation-in-part of application No. 09/568,424, filed on May 10, 2000, now Pat. No. 6,545,875.

(51) Int. Cl.
*H05K 7/02* (2006.01)
*H05K 7/06* (2006.01)
*H05K 7/08* (2006.01)

(52) U.S. Cl. ............... 361/760; 361/777; 361/775; 327/323; 327/332; 377/78

(58) Field of Classification Search ............... 361/760, 361/730, 777, 775, 761, 785; 174/72 B, 99 B, 174/250, 255, 261; 365/233, 63, 200; 710/100, 710/301; 327/323, 332; 377/78; 713/500
See application file for complete search history.

(56) References Cited

U.S. PATENT DOCUMENTS

| | | | |
|---|---|---|---|
| 5,224,023 A | 6/1993 | Smith et al. | |
| 5,276,817 A | * 1/1994 | Matschke et al. | 439/61 |
| 5,523,703 A | 6/1996 | Yamamoto et al. | |
| 5,625,169 A | 4/1997 | Tanaka | |
| 5,635,761 A | 6/1997 | Cao et al. | |
| 5,680,297 A | 10/1997 | Price et al. | |
| 5,910,151 A | 6/1999 | Adedokun | |
| 5,910,885 A | 6/1999 | Gulachenski et al. | |
| 5,943,573 A | 8/1999 | Wen | |

(Continued)

*Primary Examiner*—Kamand Cuneo
*Assistant Examiner*—Hung S. Bui
(74) *Attorney, Agent, or Firm*—Morgan, Lewis & Bockius LLP

(57) ABSTRACT

An apparatus is provided, which includes a memory interface circuit, a clock signal generating circuit, and a plurality of memory circuits. The memory circuits are operatively coupled and arranged in an order on a plurality of memory modules, such that the memory module positioned at the beginning of the order is coupled to an output of the clock signal generating circuit and the memory interface circuit. The memory module that is positioned at the end of the order is unique in that it includes a clock signal terminating circuit connected to the last memory integrated circuit. With this configuration, a clock loop is formed by directly routing the clock signal from the output of the clock signal generating circuit through each of the memory modules in the order (without connecting to any of the intervening memory integrated circuits) to the memory integrated circuit positioned at the end of the order. Then, the clock signal is asserted on the previous memory modules by routing it back through the memory integrated circuits thereon, in reverse order to the memory integrated circuit positioned at the beginning of the order and from there to the memory interface circuit. To complete the clock loop, the clock signal is again asserted by routing it from the memory interface circuit back through the memory integrated circuits in order to the memory integrated circuit positioned at the end of the order. Finally, the clock signal is terminated at the clock signal terminating circuit on the memory module positioned at the end of the order.

19 Claims, 20 Drawing Sheets

U.S. PATENT DOCUMENTS

| | | |
|---|---|---|
| 5,981,870 A | 11/1999 | Barcley et al. |
| 6,003,121 A | 12/1999 | Wirt |
| 6,005,776 A | 12/1999 | Holman et al. |
| 6,142,830 A | 11/2000 | Loeffler |
| 6,172,895 B1 | 1/2001 | Brown et al. |
| 6,243,272 B1 | 6/2001 | Zeng et al. |
| 6,392,897 B1 | 5/2002 | Nakase et al. |
| 6,404,660 B1 | 6/2002 | Gamini et al. |
| 6,765,800 B1 | 7/2004 | Haba et al. |
| 2004/0105240 A1 | 6/2004 | Haba et al. |

\* cited by examiner

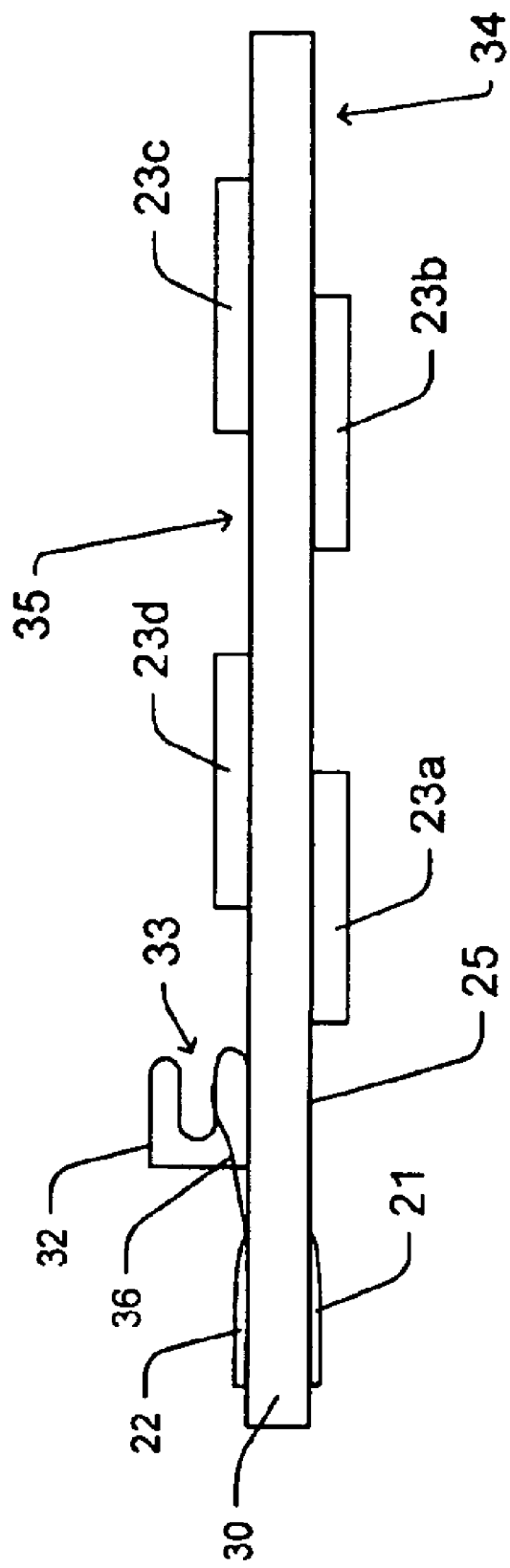

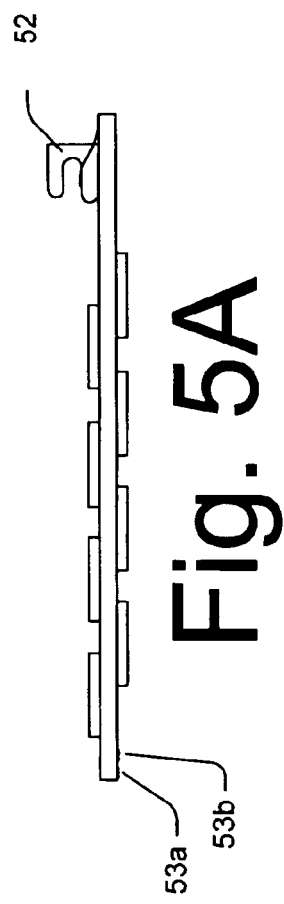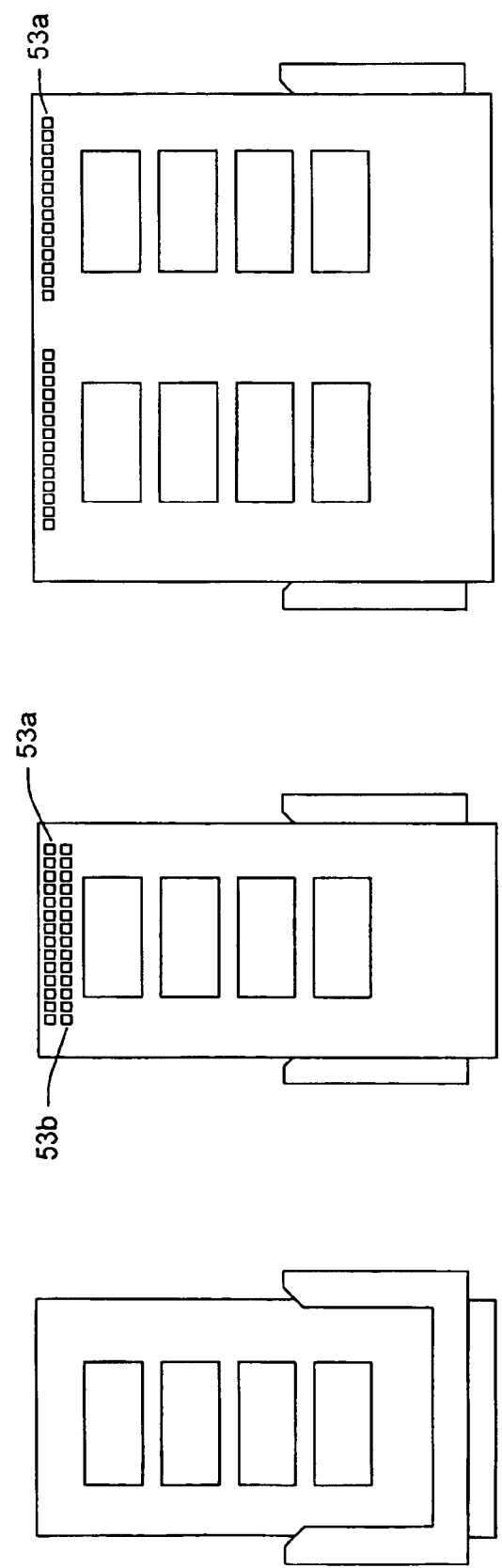
Fig. 5A
Fig. 5B
Fig. 5C
Fig. 5D

CLOCK ROUTING IN MULTIPLE CHANNEL MODULES AND BUS SYSTEMS

This U.S. Non-Provisional Patent Application is a divisional application of U.S. patent application Ser. No. 09/817,828, filed on 26 Mar. 2001 (now issued U.S. Pat. No. 6,590,781), which is a continuation-in-part (CIP) application of a U.S. patent application Ser. No. 09/568,424, filed on 10 May 2000 (now issued U.S. Pat. No. 6,545,875) and entitled "Multiple Channel Modules And Bus Systems Using Same", and which is incorporated herein by reference.

TECHNICAL FIELD

The present invention is directed to bus systems, more particularly to improved methods and arrangements for providing clock signals in multiple channel modules and bus systems.

BACKGROUND

Conventional bus systems are typically implemented in single channel architectures. While conventional bus systems have been implemented using modules, the modules in such systems have merely been arranged in a serial relationship on a motherboard. For example, consider the bus system shown in FIG. 1. This bus system is characterized by a master 11 mounted on a motherboard 10. A number of connectors 13 are also mounted on motherboard 10. Each connector 13 is adapted to receive a module 14 comprising one or more integrated circuits 15. Thus, by means of a connector 13, a module 14 is mechanically mounted and electrically connected within the bus system.

One or more bus(es) 16 forms the communications channel between master 11 and a termination resistor 12. Bus 16 typically comprises a number of signals lines communicating control information, address information, and/or data. The signal lines forming bus 16 traverse the motherboard and/or the modules to electrically connect the integrated circuits 15 to master 11.

There are numerous problems associated with such conventional bus systems. For example, the serial arrangement of the connectors and associated modules creates a relatively lengthy communications channel. Since there are many factors limiting the maximum practical length of a communications channel, channel length should, wherever reasonably possible, be minimized.

Conventional bus systems are also characterized by numerous electrical connection points between the connectors and the bus portions traversing the motherboard, between the modules and the connectors, and between the integrated circuits and the bus portion traversing the modules. Improperly matched electrical connections often produce impedance discontinuities that tend to degrade signal transmission characteristics on the bus. Accordingly, the number of impedance discontinuities associated with the bus connections should be minimized.

Such conventional bus systems present a very static architecture, which may not lend itself to the efficient utilization of available space within a larger system. For example, a maximum, pre-set number of connectors is typically provided within the conventional bus system, regardless of the actual number of modules initially contemplated for the bus system. Upgrading the bus system to include additional modules requires that a sufficient number of connectors be provided up to the maximum length (or capacity) of the channel. Typically, empty connectors are filled with dummy modules until they are needed. Absent these spare connectors, upgrading the bus system to include an additional module would require that the motherboard be replaced.

The static architecture of the conventional bus system provides a "one size fits all" approach to larger systems incorporating the bus system. The serial arrangement of connectors and modules on a motherboard may produce an undesirably large footprint within the larger system. Further, this configuration does not lend itself to irregular or crowded spaces within the larger system.

Of further concern is the routing of clock signals. High-speed clock signals require special treatment, in that they are particularly susceptible to reflections based on discontinuities in the clock loop circuit. Thus, there is a need for improved clock routing schemes that can support, not only static architectures, but also modular architectures.

SUMMARY

The present invention provides improved clock routing methods and arrangements suitable for use with modular components.

The above stated needs and others are met, for example, by an apparatus that includes a memory interface circuit, a clock signal generating circuit, and a plurality of memory circuits. The memory circuits are operatively coupled and arranged in an order on a plurality of memory modules, such that the memory module positioned at the beginning of the order is coupled to an output of the clock signal generating circuit and the memory interface circuit. The memory module that is positioned at the end of the order is unique in that it includes a clock signal terminating circuit connected to the last memory integrated circuit. With this configuration, a clock loop is formed by directly routing the clock signal from the output of the clock signal generating circuit through each of the memory modules in the order (without connecting to any of the intervening memory integrated circuits) to the memory integrated circuit positioned at the end of the order. Then, the clock signal is asserted on the previous memory modules by routing it back through the memory integrated circuits thereon, in reverse order to the memory integrated circuit positioned at the beginning of the order and from there to the memory interface circuit. To complete the clock loop, the clock signal is again asserted by routing it from the memory interface circuit back through the memory integrated circuits in order to the memory integrated circuit positioned at the end of the order. Finally, the clock signal is terminated at the clock signal terminating circuit on the memory module positioned at the end of the order.

By employing certain layouts, the memory module positioned at the end of the order can be moved between various positions depending upon the number/arrangement of memory integrated circuits. For example, a terminating memory module may be the only memory module in the order, at which point it can be operatively configured in a first slot of a multiple slot arrangement. However, should additional memory modules be required this terminating memory module can be moved to a slot further in the order to allow for the additional memory modules there between. Certain exemplary configurations of such arrangements are shown in the detailed description. These exemplary implementations have a three-slot order. However, those skilled in the art will recognize that orders of three or greater slots/memory modules can be supported by the clock routing schemes in accordance with the present invention.

BRIEF DESCRIPTION OF THE DRAWINGS

A more complete understanding of the various methods and arrangements of the present invention may be had by reference to the following detailed description when taken in conjunction with the accompanying drawings wherein:

FIG. 3A is an edge view of one embodiment of a module according to the present invention.

FIG. 5A is an edge view of another embodiment of a module according to the present invention.

FIGS. 5B and 5C are respectively top and bottom views of a single channel module according to the embodiment shown in FIG. 5A.

FIG. 5D illustrates a two channel module consistent with the embodiment shown in FIG. 5A.

DETAILED DESCRIPTION

Figure 1:
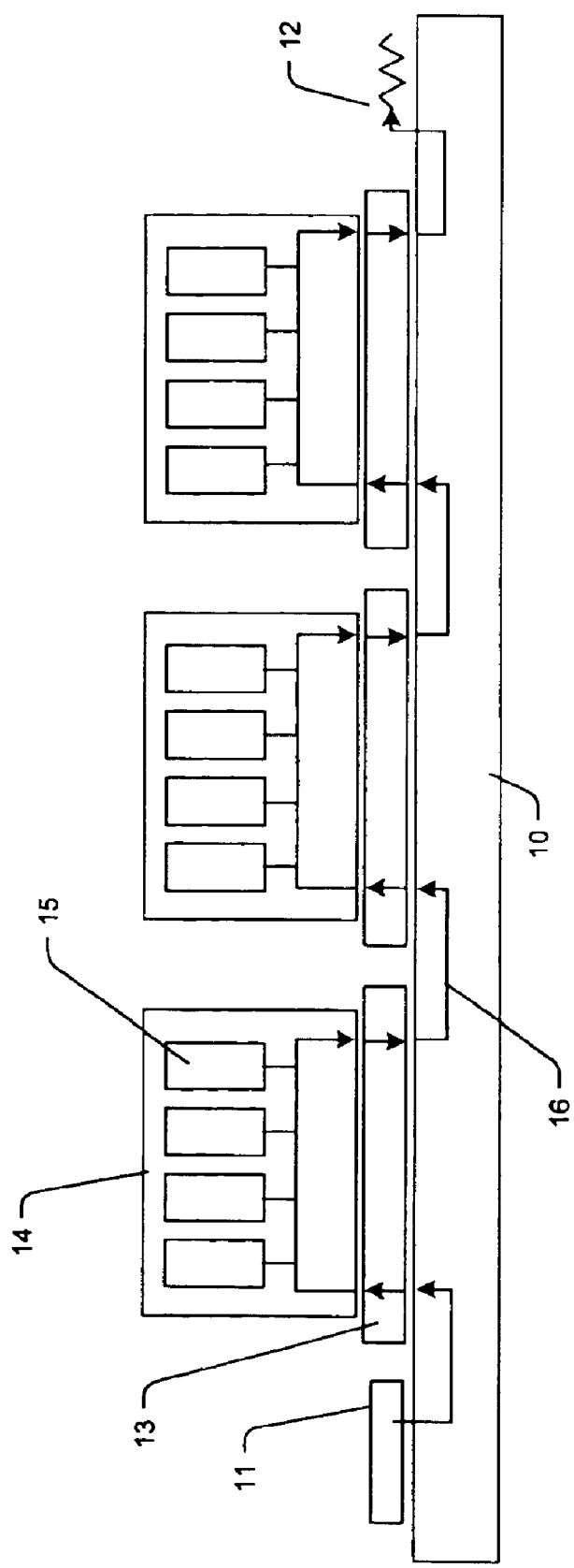
FIG. 1 illustrates a conventional bus system architecture.
Figure 2:
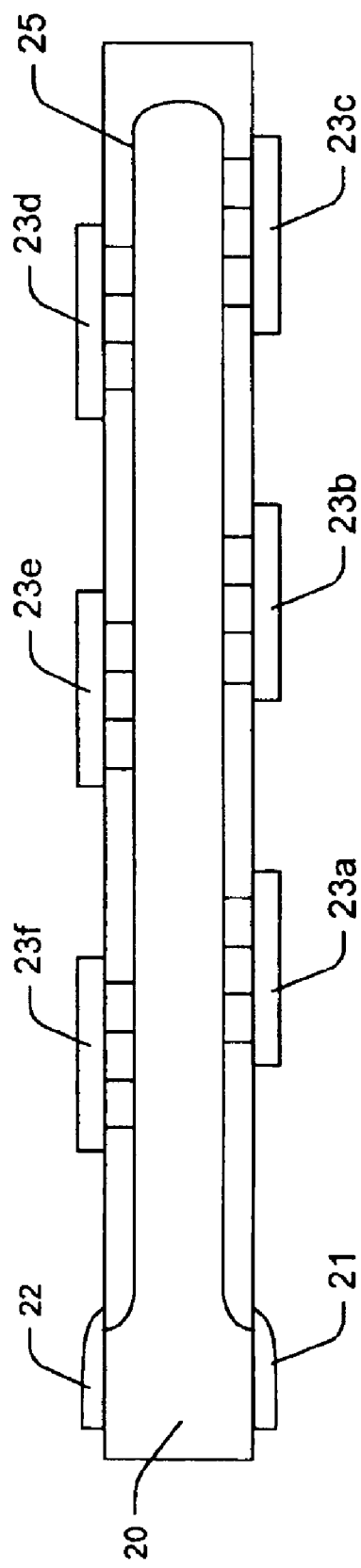
FIG. 2 illustrates a module adapted for use within the present invention.

An exemplary implementation of the module claimed in this related application is shown in FIG. 2. Here, the module comprises a printed circuit board 20 and a plurality of integrated circuits (ICs) 23a–23f mounted thereon. At one end of PCB 20, a first set of edge fingers 21 are disposed on a first primary surface of the PCB and a second set of edge fingers 22 are disposed on an opposing second primary surface of the PCB. Edge fingers are well-known connection mechanisms that allow the module to be mechanically secured within a connector (not shown) and electrically connected to a plurality of signal lines provided at the connector.

A bus 25 internal to the module extends from the first set of edge fingers 21, traverses substantially the entire first primary surface of the PCB, folds back at the distant end of the PCB, traverses substantially the entire second primary surface of the PCB, and terminates at the second set of edge fingers 22. Bus 25 typically comprises a plurality of signal lines. The signal lines forming bus 25 may run on top the first and second surfaces of PCB 20. Alternatively, bus 25 may be formed within the body of PCB 20. ICs 23a–23f are respectively connected to this plurality of signal lines.

As described in the related application, the foregoing module may be used in conjunction with a related connector to implement bus systems having improved signal transmission characteristics. Overall channel length and impedance discontinuities related to motherboard connections are reduced. Further, by means of the novel connector and associated module structure described in the related application, bus systems may be implemented in a number of ways. For example, modules may be vertically stacked one above the other, or horizontally racked one next top the other within a single connector.

The present invention allows additional flexibility in the design and implementation of bus systems. Whereas the former invention relies substantially upon the design of the multi-slot connector to flexibly implement bus systems, the present invention relies more on module design.

To this end, consider the module shown in FIG. 3A. Like the module shown in FIG. 2, the module of FIG. 3A comprises a printed circuit board 30 and a plurality of integrated circuits (ICs), here 23a–23d. Of note, the exemplary module of FIG. 2 mounts six (6) ICs connected to bus 25 which is formed within the body of PCB 20, whereas the example shown in FIG. 3A mounts only four (4) ICs connected to bus 25 running on top of the first and second primary surfaces of PCB 30. Within the context of the present invention, any reasonable number of ICs may be mounted on the module. ICs may populate one or both primary surfaces of the module. However, it is presently preferred to populate both primary surfaces of the module since this tends to further reduce channel length.

The module shown in FIG. 3A further comprises a right angle connector 32. Right angle connector 32 is mounted on PCB 30 and comprises a connection slot 33 adapted to receive another module. The "right-angle" nature of the connector nominally provides that slot 33 opens at a right angle to the surface upon which it is mounted. Such an arrangement allows modules to connected one to another in parallel planes. However, one or more modules might be configured with a multi-slot connector as described in the related application.

In the illustrated example of FIG. 3A, bus 25 extends from a first set of edge fingers 21 at a first end of PCB 30, substantially traverses the first primary surface 34, folds back at a second end of PCB 30, substantially traverses the second primary surface 35, and terminates at right angle connector 32. Thus, whereas the module bus portion shown in FIG. 2 extends from first edge fingers 21 to second set of edge fingers 22, the module bus portion shown in FIG. 3 extends from first set of edge fingers 21 to right angle connector 32. ICs 23a–23d respectively connect to the signal lines forming bus 25.

Right angle connector 32 may include one or more signal lines 36 connected back to edge fingers 21, and/or connected to a second set of edge fingers 22. Signal lines 36 might be used, for example, as ground connections.

The modules may implement one or channels. The term "channel" is broadly defined to define one or more signal lines communicating information between two points. In the following examples, one or more ICs are typically associated with a channel, and the channel communicates information from a master (a controlling device) to a slave (a responding device). However, one of ordinary skill in the art will understand that the ICs in the following examples may be replaced with connectors allowing connection of an auxiliary channel. The ICs in the following examples may be memory devices, receivers, transceivers, logic devices, or other control devices.

Figure 3D:
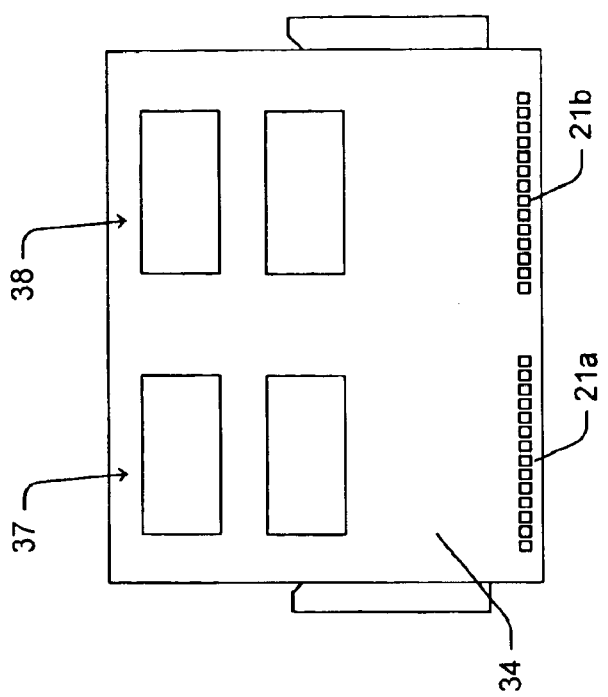
FIG. 3D illustrates a two channel module consistent with the embodiment shown in FIG. 3A.
Figure 3C:
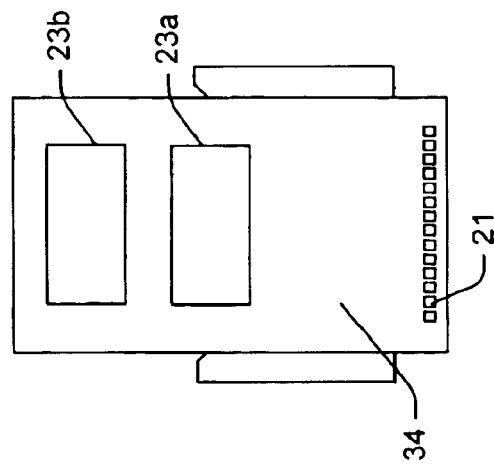
FIGS. 3B and 3C are respectively top and bottom views of a single channel module according to the embodiment shown in FIG. 3A.
Figure 3B:
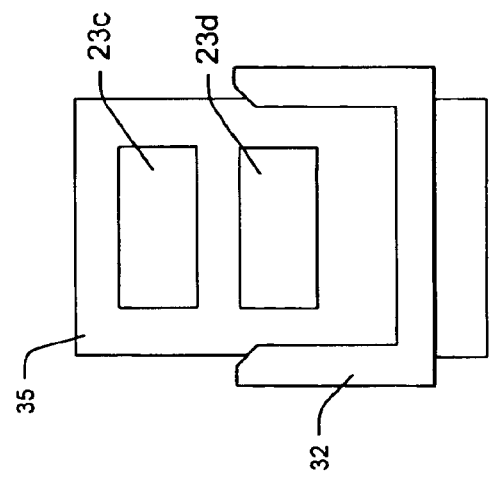

FIGS. 3B and 3C shown top and bottom views of module illustrated in FIG. 3A. FIG. 3D illustrates a module similar to the one illustrated in FIGS. 3A–3C. However, the module shown in FIG. 3D implements two channels 37 and 38 on a single module. First channel 37 is associated with a first internal bus running from a first plurality of edge fingers 21a. Second channel 37 is associated with a second internal bus running from a second plurality of edge fingers 21b.

Figure 4:
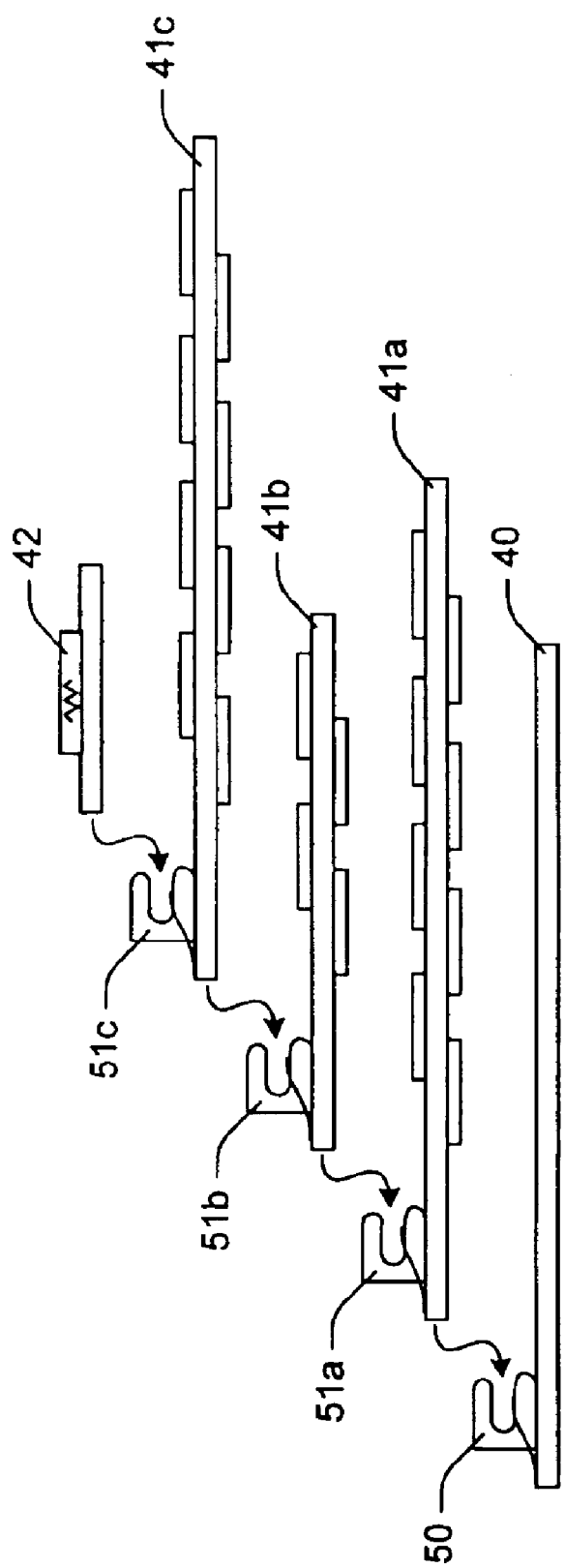
FIG. 4 illustrates a bus system formed by the interconnection of multiple modules according to the embodiment shown in FIGS. 3A through 3D.

Whether the modules of the present invention implement one or more channels, they may be flexibly configured to form a bus system. FIG. 4 illustrates one such bus system. For clarity, FIG. 4 and subsequent illustrations of modules and bus systems omit labeling readily discernable elements such as the ICs and the PCB, which have been described above.

In FIG. 4, a motherboard 40 comprises a first right angle connector 50. The "motherboard" is nominally any printed circuit board having the first right angle connector, but typically comprises a master controlling signal transmissions on the bus. In the example, a first module 41a comprising right angle connector 51a is mechanically secured and electrically connected to motherboard 40 through right angle connector 50. Similarly, right angle connector 51a connects module 41b, and right angle connector 51b connects module 41c.

Such module-to-module connection may continue until a bus system of desired size and configuration is completed. Alternatively, at some point, the channel(s) defined between the master on motherboard 40 and the ICs on the last module will reach its maximum practical length. In either event, when the bus system is complete the signal lines of the bus are terminated in a matched impedance. Signal line termination may be done in a set of termination resistors on the last module, or by means of a special termination module 42 connected to the right angle connector 51c of the last module. By using termination module 42, the other modules need not include termination resistors.

Another embodiment of the modules according to the present invention is shown in FIGS. 5A–5D. The module shown in FIG. 5A does not make use of the folded internal bus structure described above. Rather, one or more sets of finger connectors (53a and 53b) are disposed on either the first or second primary surfaces of the module PCB. Alternatively, the first and second primary surfaces may each include one or more sets of edge fingers. The one or more internal bus(es) associated with these edge fingers substantially traverse the length of the module from one (1st) end to another (2nd) end connecting related ICs along the way. The one or more internal bus(es) then terminate at right angle connector 52.

FIGS. 5B and 5C shown respectively top and bottom views of the module shown in FIG. 5A. FIG. 5D illustrates a two channel version of this module.

Figure 6:
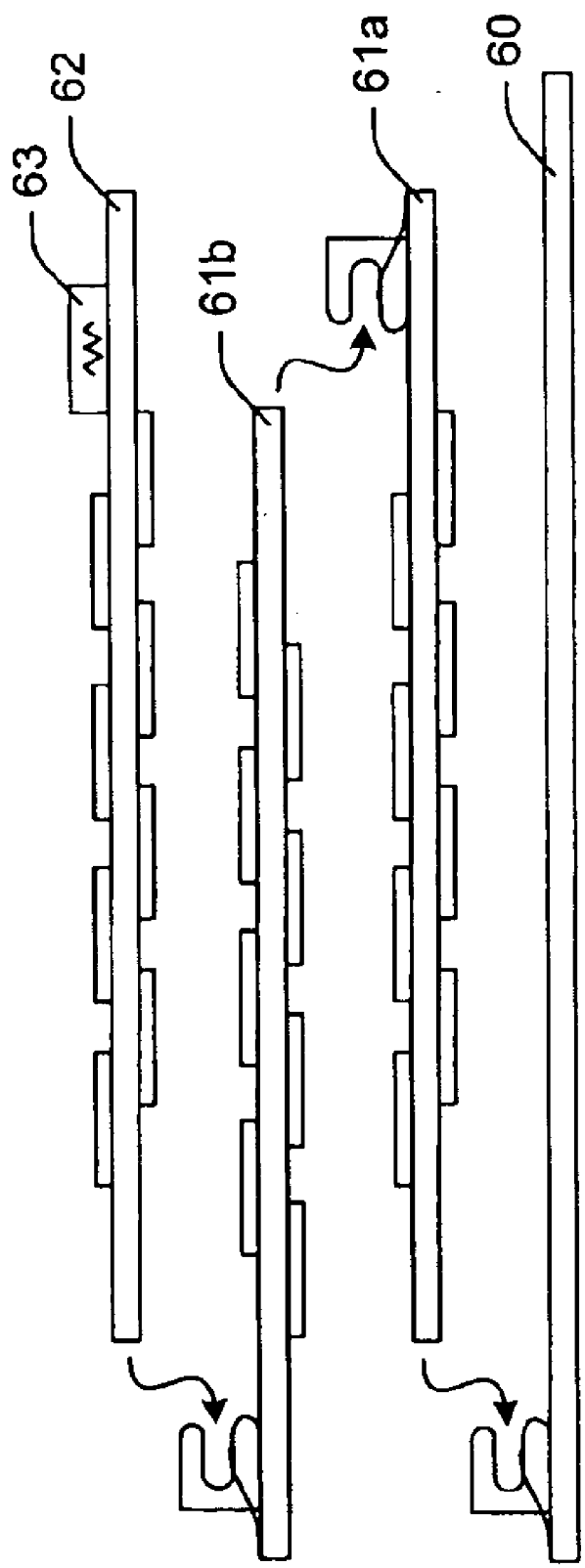
FIG. 6 illustrates a bus system formed by the interconnection of multiple modules according to the embodiment shown in FIGS. 5A through 5D.

An exemplary bus system configured with the modules of FIGS. 5A–5D is shown in FIG. 6. When used to configure a horizontally disposed bus system, the bus system of FIG. 6 may provide additional mechanical stability over the bus system illustrated in FIG. 4, since right angle connectors will be placed on both left and right "ends" of the bus system.

In the example shown in FIG. 6, the right angle connector on motherboard 60 receives first module 61a, which receives second module 61b. Module 62 is a base module incorporating termination impedance 63.

Figure 7A:
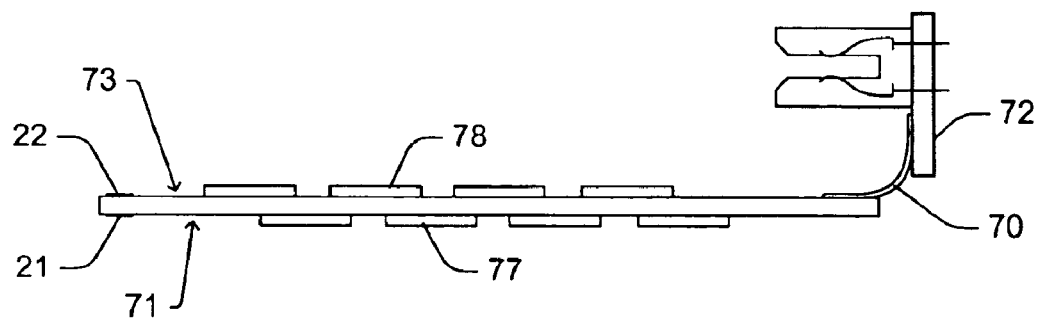
FIG. 7A is an edge view of yet another embodiment of a module according to the present invention.
Figure 7B:
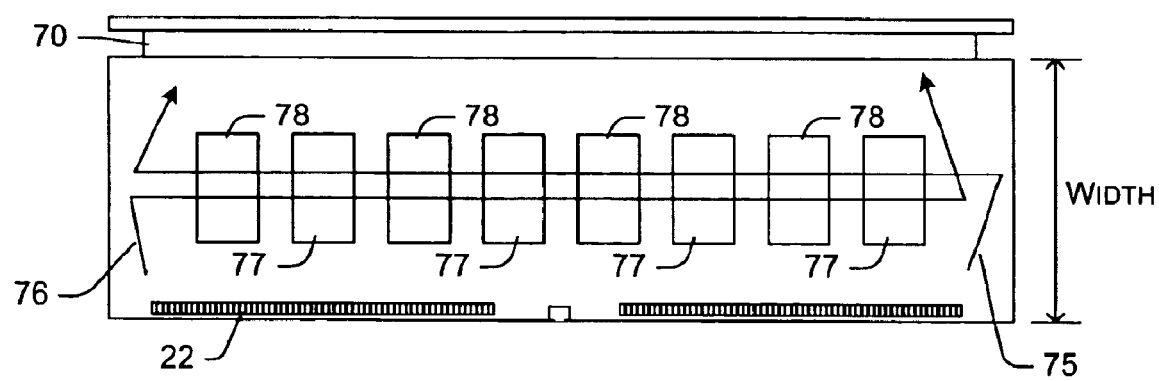
FIGS. 7B is a top view of the module of FIG. 7A further illustrating a two channel option to the module's implementation.

Yet another implementation of the modules according to the present invention is shown in FIGS. 7A and 7B. This module does not use the right angle connectors illustrated in FIGS. 4 through 6 inclusive. Rather, the one or more internal bus(es) terminate at one end of the module in a flex tape connector 70 coupled to an electrical connector 72. Electrical connector 72 may be of conventional implementation. As before, one or more sets of edge fingers (21 and 22) are disposed at the other end of the module on the first primary surface and/or the second primary surface of the PCB. While the embodiment shown in FIG. 7A lends itself to the same channel structures shown in FIGS. 5B–5D, a further refinement of the channel structures is illustrated in FIG. 7B.

In FIG. 7B, a first sub-plurality of ICs 77 populate the first primary surface 71 of the PCB and a second sub-plurality of ICs 78 populate the second primary surface 73 of the PCB. A first internal bus originates at one set of edge fingers 21, laterally traverses the first plurality of ICs 77 and terminates at flex tape connector 70. A second internal bus originates at another set of edge fingers 22, laterally traverses the second plurality of ICs 78 and terminates at flex tape connector 70. In this manner, two channels are implemented which traverse opposing primary surfaces of the PCB in opposite directions. The width of the PCB can therefore be reduced. Compare the width of the module in FIG. 5D.

Figure 8:
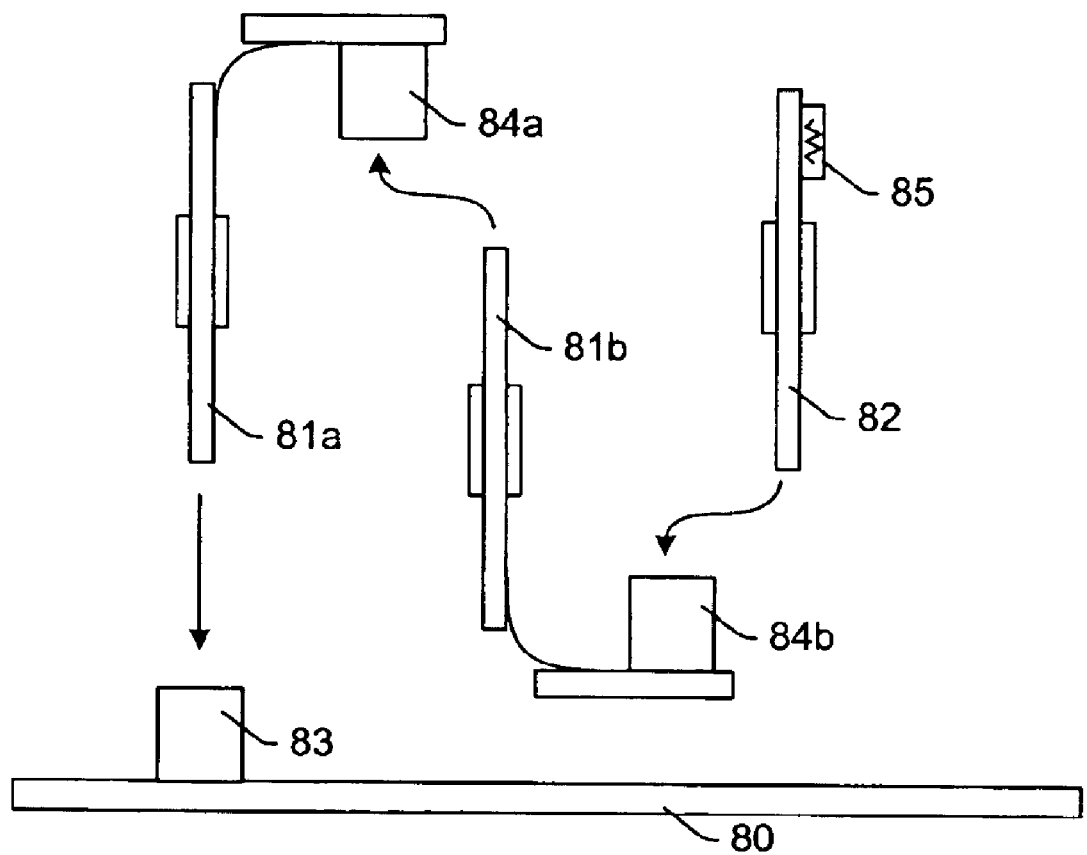
FIG. 8 illustrates a bus system formed by the interconnection of multiple modules according to the embodiment shown in FIGS. 7A and 7B.

An exemplary memory system configured with the module of FIG. 7A is shown in FIG. 8. Within this system motherboard 80 comprises connector 83, which receives first module 81a, which in turn receives second module 81b in connector 84a. Connector 84b on second module 81b receives a base module 82 incorporating termination resistor 85. The combination of flex tape and connector allows a bus system comprising multiple modules to be implemented in a variety of forms.

Figure 9A:
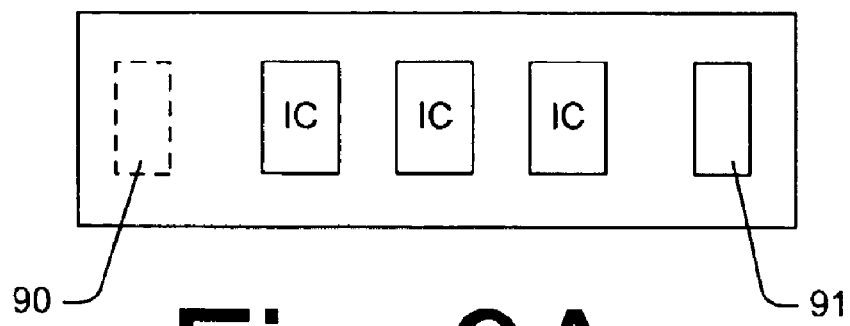
FIGS. 9A and 9B illustrate yet another embodiment of a single channel module according to the present invention.
Figure 9B:
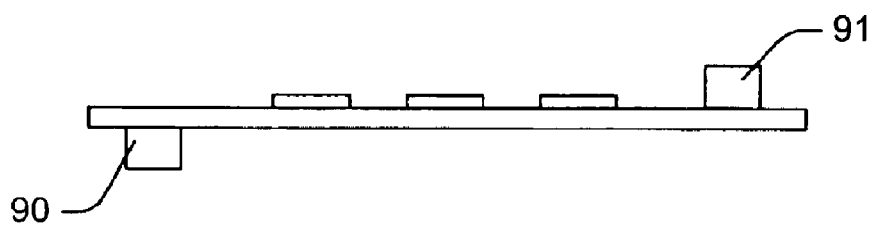

In fact, single channel and multiple channel modules may be implemented in a number forms using conventional electrical connectors. FIGS. 9A and 9B illustrate a single channel module which may be "stacked" or otherwise combined with similar modules to form a bus system having a reduced footprint and a relatively short channel length. Within the module shown in FIGS. 9A and 9B, the internal bus runs from a first connector 90 mounted on a first primary surface of the module, across the length of the module, and terminates in second connector 91 mounted on the second primary surface of the module.

Figure 9C:
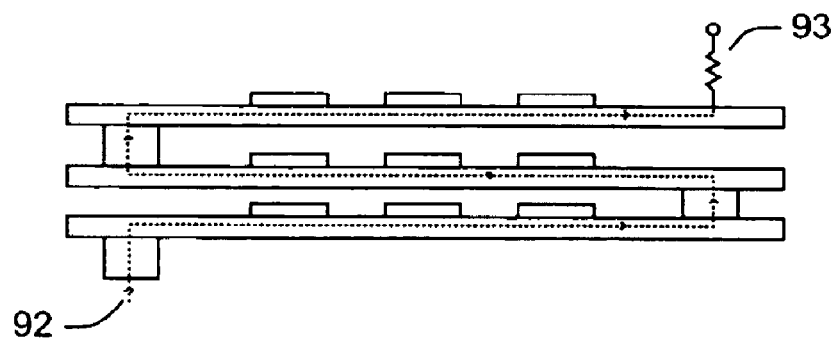
FIG. 9C illustrates a bus system formed by the interconnection of multiple modules according to the embodiment shown in FIGS. 9A and 9B.

FIG. 9C illustrates a bus system implemented with a number of these modules. A channel path 92 is indicated through the bus system, which enters the first module at its first connector and thereafter zigzags though the connected modules as shown until it reaches termination resistor 93. The modules used in the bus system of claim 9C are shown with a single bus traversing ICs populating only one primary surface of each respective PCB. As noted above, a plurality of buses may occupy the channel and one or more of the modules may include ICs on both primary surfaces.

Figure 10A:
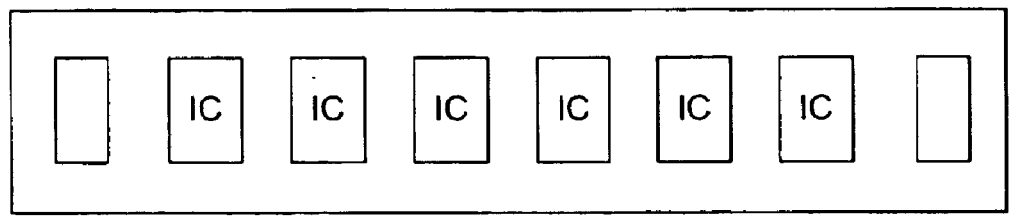
FIGS. 10A and 10B illustrate still another embodiment of a two channel module according to the present invention.
Figure 10B:
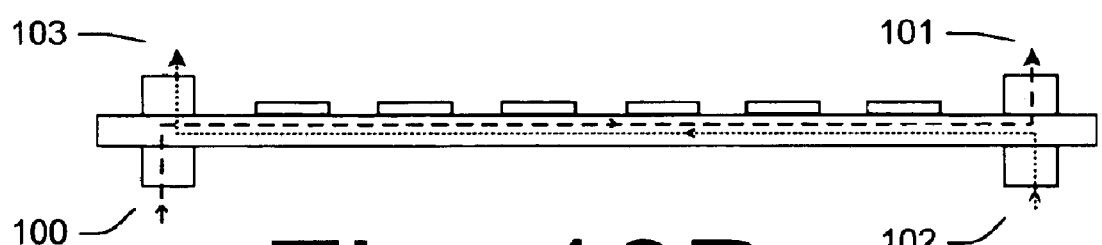

An exemplary two-channel module is illustrated in FIGS. 10A and 10B. Here, a first channel path extends from a first connector 100 on the first primary surface of the PCB across the length of the PCB to a second connector 101 on the second primary surface of the PCB. A second channel path extends from a third connector 102 on the first primary surface of the PCB across the length of the PCB to a fourth connector 103 on the second primary surface of the PCB. Thus, first and second channels run counter-directional to one another.

Figure 11A:
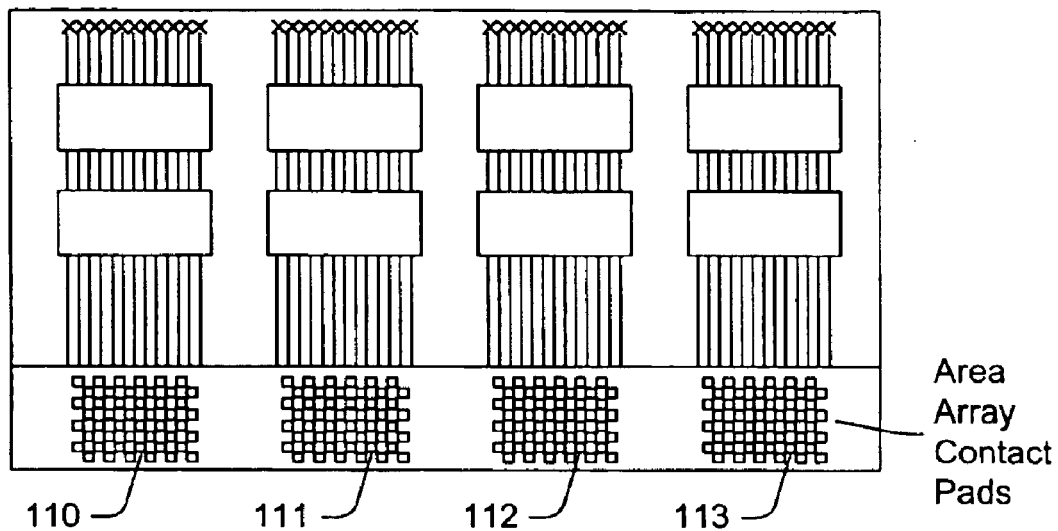
FIGS. 11A and 11B illustrate another embodiment of a four channel module according to the present invention.
Figure 11B:
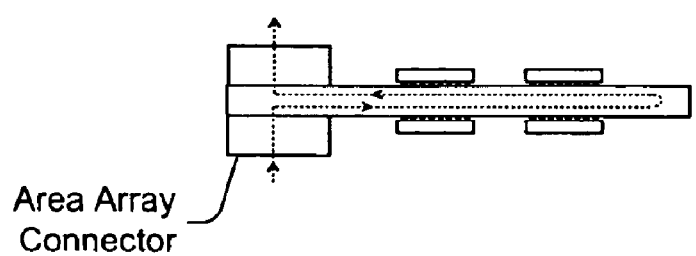
Figure 11C:
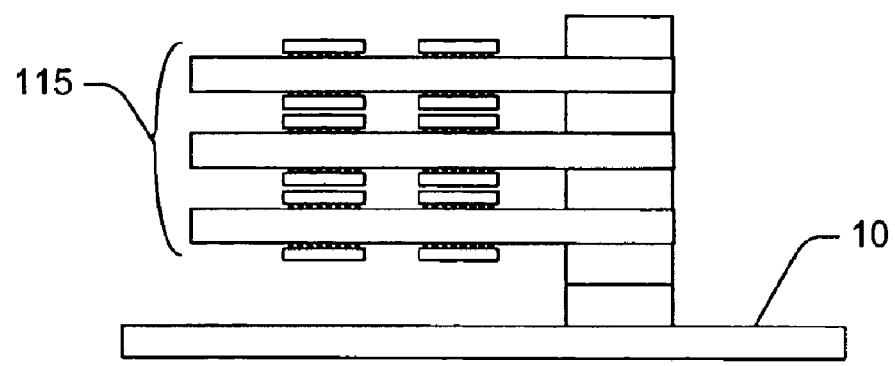
FIGS. 11C and 11D illustrate stacked horizontal and vertical module configurations using the modules shown in FIGS. 11A and 11B.
Figure 11D:
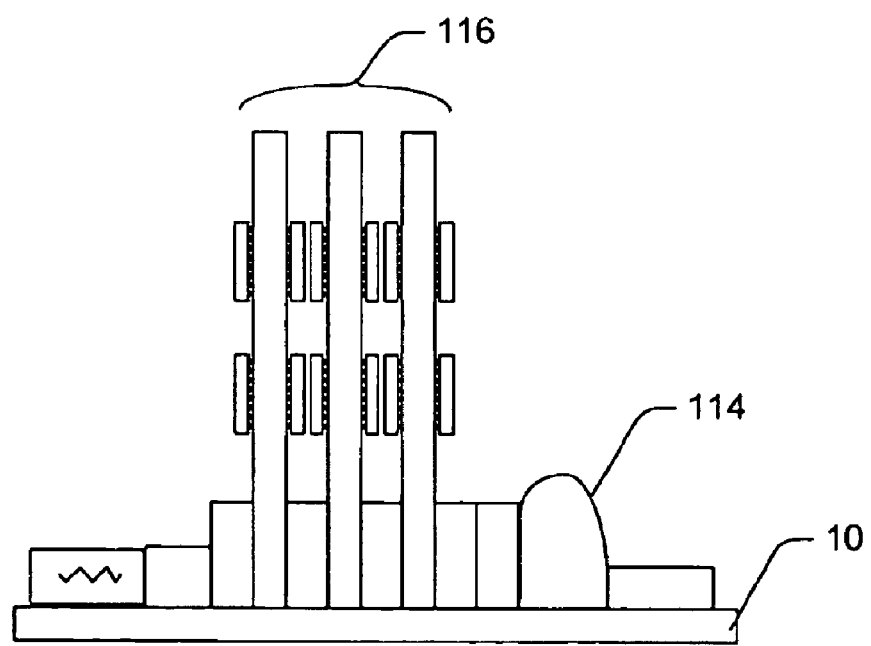

The module of shown in FIGS. 10A and 10B includes a single row of ICs. One of ordinary skill in the art will appreciate that a number of IC rows might be mounted on the module. An exemplary four channel module is illustrated in FIGS. 11A and 11B. The module includes four sets of (area array) connectors 111, 112, 113, and 114, each set having a first connector mounted on the first primary surface and a second connector mounted on the second primary surface of the PCB. As shown in FIG. 11B, an internal bus is formed between the first and second connector in each connector set. That is, each bus originates at a first edge of the PCB at a first connector, traverses the width of the module, folds back at a second edge of the PCB, and re-traverses the width of the module until it reaches the second connector in the connector set. The modules shown in FIGS. 11A and 11B may be stacked in horizontal 115 and vertical 116 configurations on motherboard 10 as illustrated in FIGS. 11C and 11D. The vertically stacked configuration 116 of FIG. 11D is connected through a flexible connector 114.

Each one of the foregoing examples makes use of a number of connectors. In addition to providing a connection path between respective internal buses, the structure of the connector may also be used to provide mechanical support for modules, which are stacked one above the other, or racked one next to the other in a bus system. While this feature is often desirable in the implementation of certain bus system architectures, the present invention has broader applications.

For example, the present invention may be adapted to take full advantage of conventional ribbon connectors and similar flexible connectors. By means of these connectors, modules forming a bus system need not be stacked or racked in close proximity one to another. Rather, module may be placed at greater distances one to another and may be mounted within a larger system at odd angles one to another. While separating modules will increase the channel length, there are many applications where reduced channel length will be happily traded away for ease and flexibility of implementation.

Before illustrating the use of flexible connectors, several modules structures will be described. Each of these module structures makes use of "finger connectors." The term "set of edge fingers" has been used above to described a class of electrical connectors characterized by a number of parallel electrical contacts disposed near the edge of a PCB and adapted to "mate" with a corresponding connector slot. Edge fingers are generally pushed into the connector slot to make electrical bus connections and provide mechanical support to the module.

While often located near or at the edge of a PCB, a set of finger connectors need not be located on the edge of the PCB. A set of finger connectors, like a set of edge fingers, typically comprises a set of parallel electrical contacts. In the context of a bus, each electrical contact typically corresponds to a bus signal line. Ribbon connectors and other flexible parallel connectors are well adapted to interconnect such parallel electrical contact structures. However, a ribbon connector may be coupled to a set of finger connectors anywhere on the PCB, not just the edge. Thus, the term finger connector may denote an edge finger, but may also denote a more generic electrical contact.

Figure 12A:
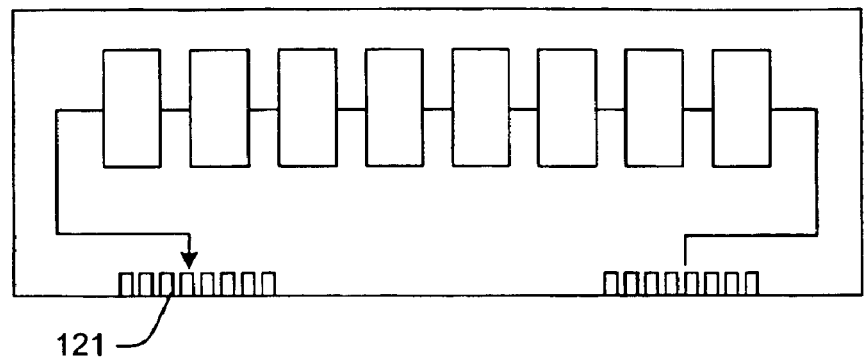
FIG. 12A illustrates yet another one channel embodiment of the present invention.
Figure 12B:
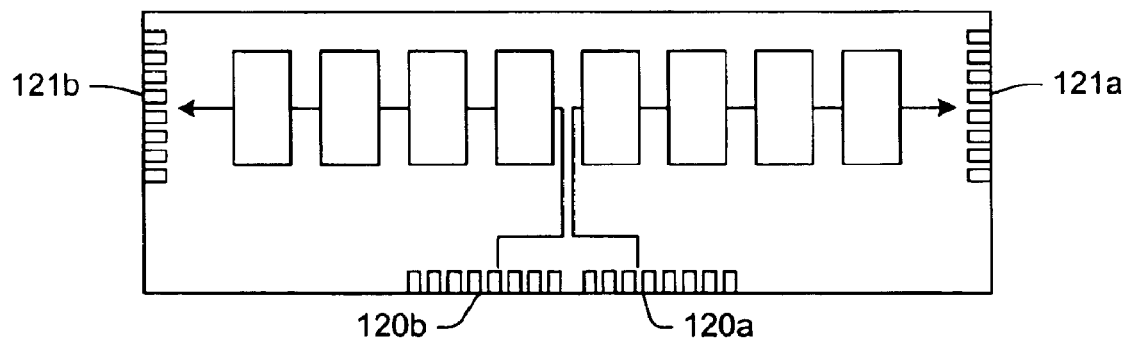
FIG. 12B illustrates yet another two channel embodiment of the present invention.
Figure 12C:
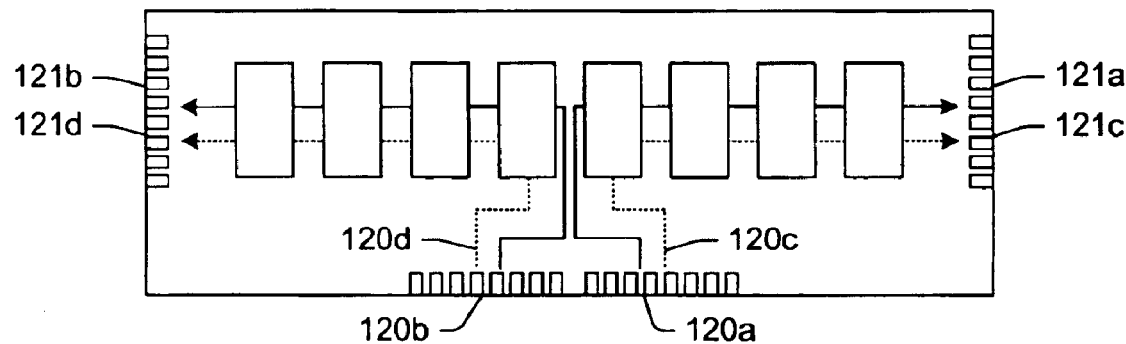
FIG. 12C illustrates yet another four channel embodiment of the present invention.

FIGS. 12A, 12B, and 12C illustrate a single channel module, a two channel module, and a four channel module respectively. The single channel module shown in FIG. 12A comprises a set of input finger connectors 120 and a set of output finger connectors 121. An internal bus substantially traverses the length of the module running from the set of input finger connectors 120 to the set of output finger connectors 121. Along the way, a plurality of ICs are connected to the internal bus. The multi-channel modules shown in FIGS. 12B and 12C include additional sets of input finger connections and additional sets of output finger connectors. The third and fourth internal buses on the module shown in FIG. 12C are disposed on the other primary surface (i.e., the bottom surface in relation to the illustration).

In these examples, the respective sets of input finger connectors (120 and 120a–120d) as well as the output connector 121 in FIG. 12A are edge fingers. Accordingly, the modules may be coupled within a bus system by pushing the edge fingers into a corresponding connector(s). The corresponding connector(s) provide the input signals to the module's internal bus(es). However, the sets of output finger connectors (121a–121d) on the modules shown in FIGS. 12B and 12C are adapted to be connected with one or more ribbon or similar flexible connector(s).

Figure 13A:
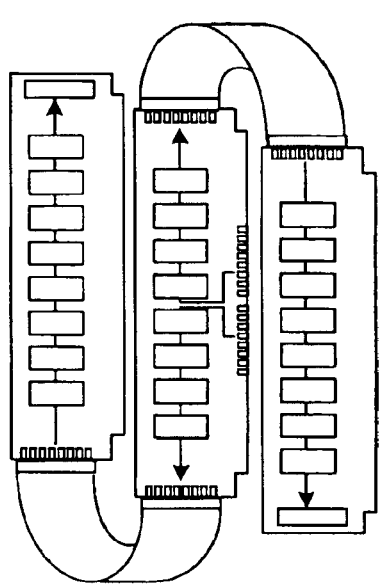
FIGS. 13A, 13B, 13C, and 13D illustrate various two channel bus systems implemented using variations on the modules described in FIGS. 12A, 12B, and 12C.
Figure 13C:
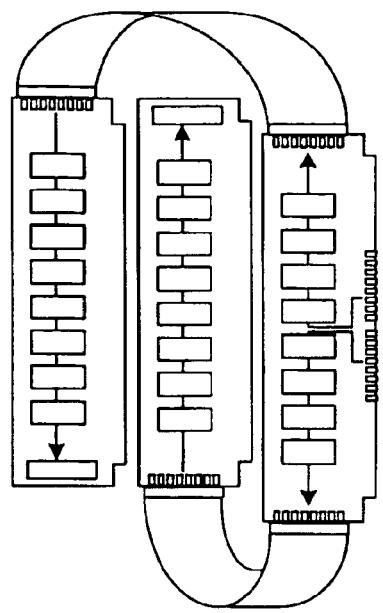
Figure 13B:
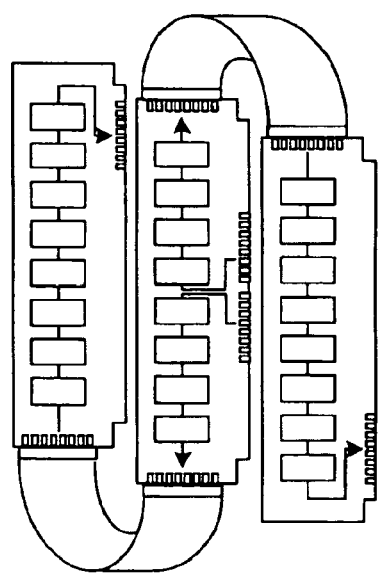
Figure 13D:
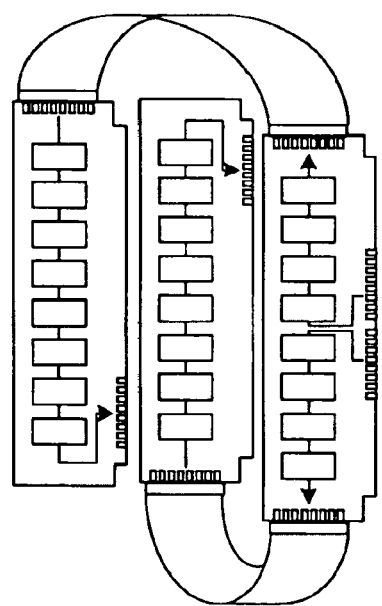

Utilizing one or more of the modules illustrated above, bus systems having various configurations may be implemented using one or more flexible connector(s). Consider the examples shown in FIGS. 13A, 13B, 13C, and 13D. Only two channel bus systems are illustrated, but from these examples one of ordinary skill in the art will readily discern how any reasonable number of "N" channels may be implemented in a bus system. Note that the various channels may be terminated in either a set of output finger connectors (FIGS. 13A and 13C), and/or in an on-module set of termination resistors (FIGS. 13B and 13D), for example.

Figure 14B:
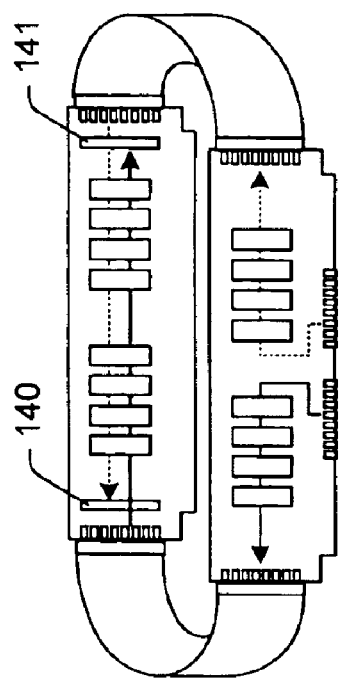
FIGS. 14A, 14B, and 14C further illustrate various two channel bus systems having a number of different termination options.
Figure 14C:
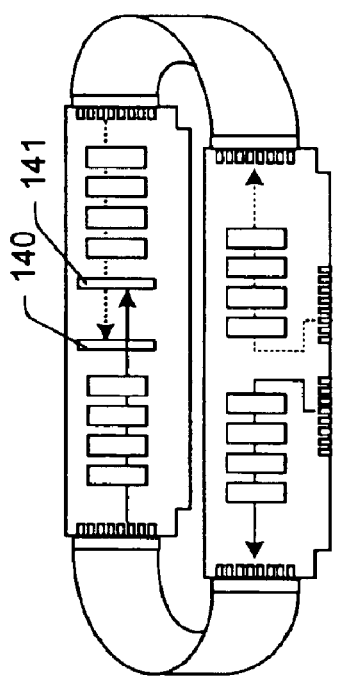
Figure 14A:
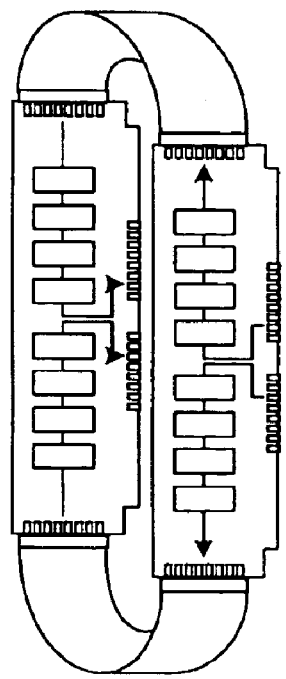

FIGS. 14A, 14B, and 14C illustrate further examples of two channels bus systems having various connection and termination schemes. Like the ICs on these modules, more than one termination element may be mounted on either primary surface. See termination elements 140 and 141 in FIGS. 14B and 14C.

Figure 15A:
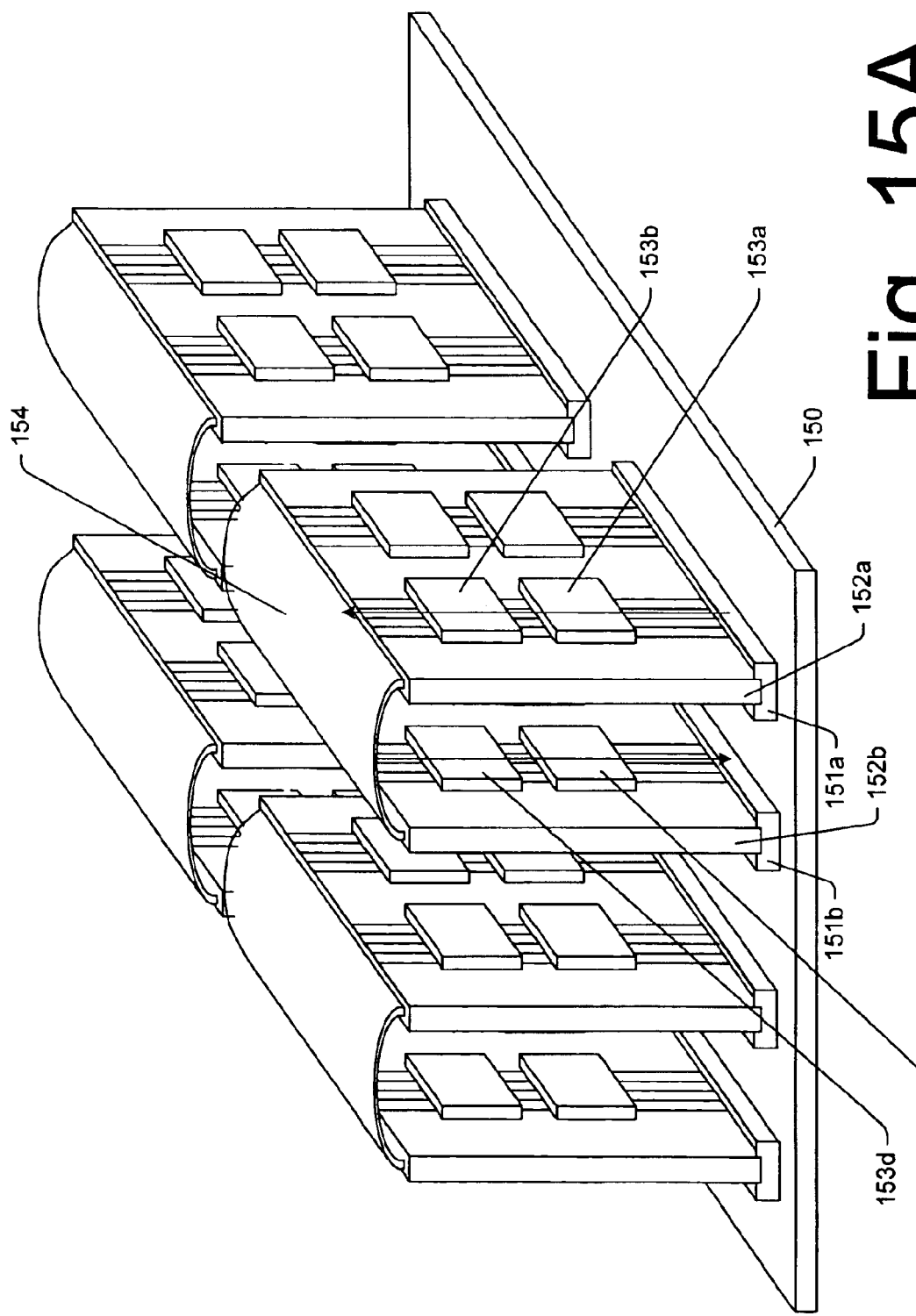
FIGS. 15A and 15B illustrate embodiments using a top edge mounted flexible connector.
Figure 15B:
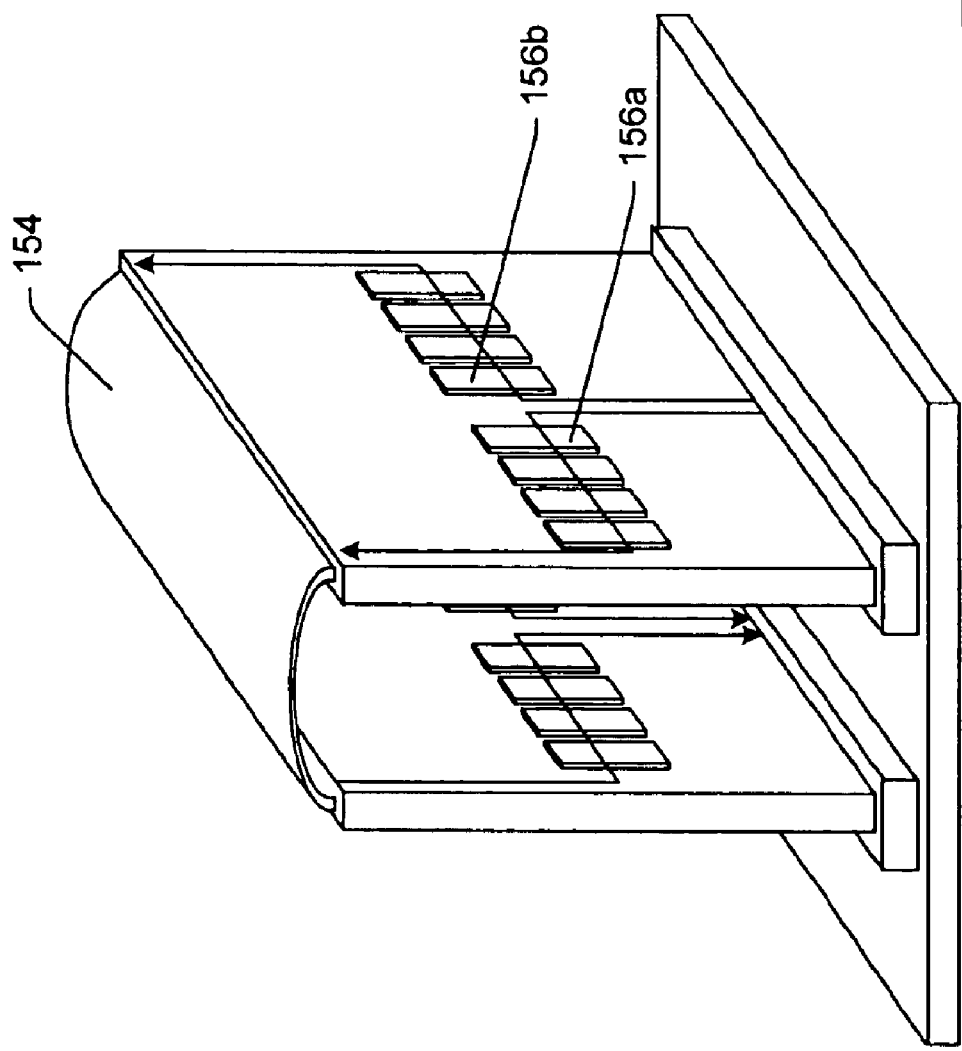

In FIGS. 15A and 15B, a flexible connector 154 is used to connect modules. However, unlike the former examples in which a flexible connector was attached to the modules via a lateral edge, the bus systems shown in FIGS. 15A and 15B use a flexible connector attached via a top edge. In particular, adjacent modules 152a and 152b are respectively mounted on motherboard 159 via connectors 151a and 151b. Module 152a comprises ICs 153a and 153b arranged in a vertical column. Module 152b comprises ICS 153c and 153d, which are likewise arranged in a column.

ICs 153a, 153b, 153c, and 153d can, for example, be connected in a channel extending from a edge lower fingers on module 152a, through an internal bus portion on module 152a, through flexible connector 154, down through an internal bus portion on module 152b, to be terminated at a lower set of edge fingers on module 152b. Other channels may be similarly implemented.

The bus system shown in FIG. 15B illustrates another way in which a plurality of ICs may be effectively mounted on a module in one or more channels. Here, rather than arranging ICs in vertical columns, the ICs are arranged in rows. A single channel may begin at a centrally located set of edge fingers, make a right turn near the center of the module, extend laterally through the row of ICs, and then make another right turn into flexible connector 154. This path is reversed in the adjacent module. In this manner, first and second pluralities of ICs (156a 156b) may be arranged in rows on each one of the modules and connected as shown.

As illustrated in these examples, the present invention provides modules adapted to be configured with one or more channels. While the foregoing examples have been drawn to multiple channel embodiments, in every case a single channel may be implemented. The modules may be interconnected using various connectors to form bus systems. Such bus systems may be implemented in a variety of configurations and channel definitions. Relative channel lengths may be reduced given a defined set of configuration requirements. Bus interconnections within the system may also be reduced, thereby reducing the potential for impedance mismatches and undesired channel loading.

As with many mechanical systems, the examples given above may be modified in many ways. The use of right angle connectors has been described, as well as the use of conventional connectors including ribbon and other flexible connectors. Other connector types may be used within the present invention. Channel path definition, integrated circuit layout, and internal bus routing on the various modules may also be readily adapted to suit the system designer's purpose.

Figure 16:
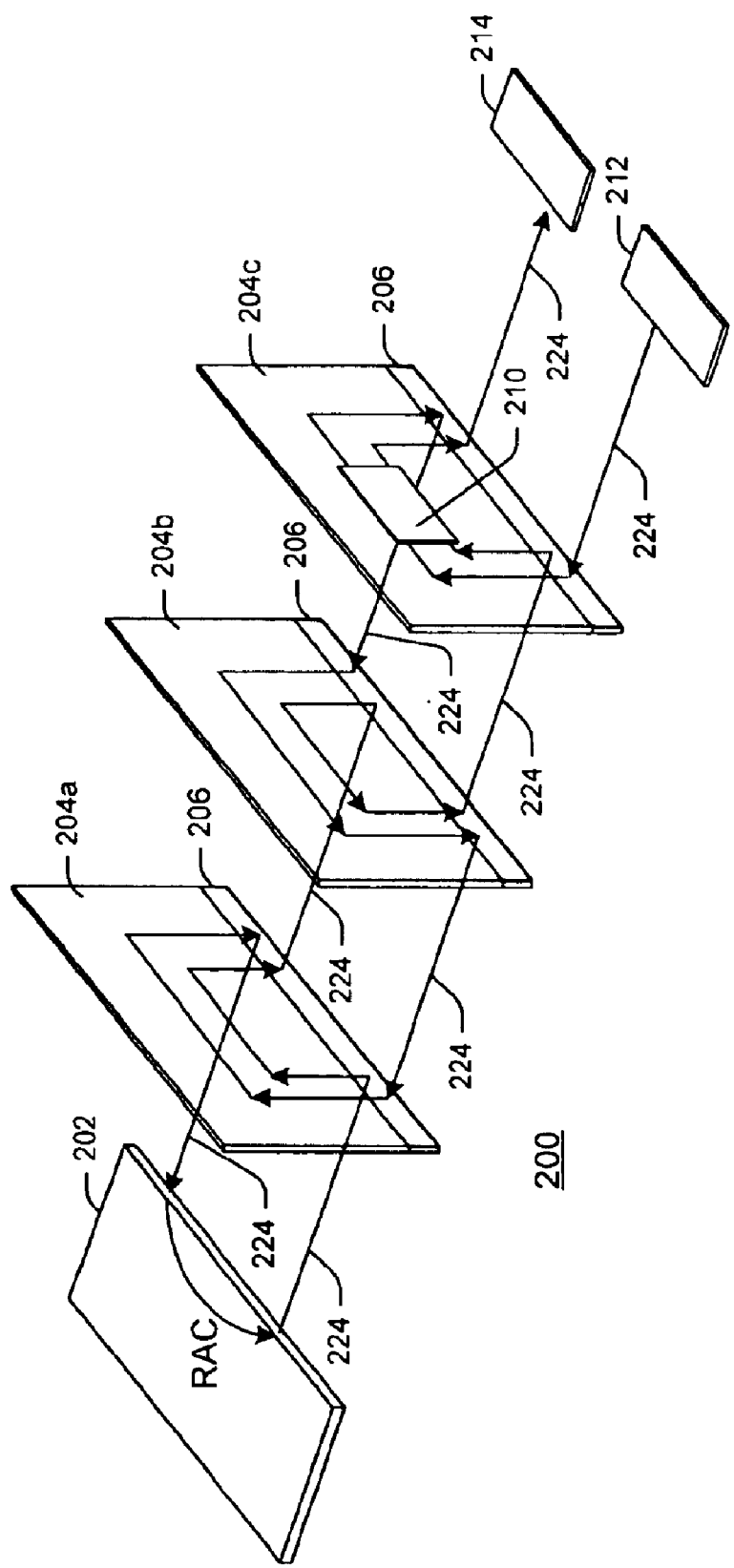
FIG. 16 illustrates a clock routing scheme, wherein a plurality of continuity modules are provided to complete the clock loop circuit to a configured memory module.

Reference is now made to the exemplary single channel clock routing scheme depicted in FIG. 16. Here, a plurality of circuit components and modules are provided as part of PCB 200. As shown, a direct Rambus ASIC Cell (RAC) 202 is provided and configured as an interface to a high-speed channel, which carries data and control signals, including timing (i.e., clock signals), to a plurality of memory modules (204a–c) and other mounted circuitry. Only one of these memory modules, namely memory module 204c, is populated with at least one memory integrated circuit 210. Two "continuity" memory modules 204a–b are provided and interconnected between memory module 204c and RAC 202. Memory module 204c and continuity memory modules 204a–b are connected to PCB 200 using connectors 206.

In this example, only the clock routing circuitry is depicted, as beginning at clock generator 212 passing through traces 224 on PCB 200, memory module 204c, continuity modules 204b and 204a to RAC 202. Then the clock signal loops back from RAC 202 through traces on PCB 200, continuity modules 204a and 204b, memory module 204c (and integrated circuit 210) to terminating circuit 214.

One of the problems with this clock routing scheme is that continuity modules 204a–b are required to complete the clock loop. Note that while the traces shown in FIG. 16 are depicted as having sharp turns, in reality the traces will likely have more subtle transitions to avoid unwanted discontinuities/reflections. In any case, the clock routing scheme depicted in FIG. 16 tends to be more expensive due to the need for continuity memory modules 204a–b, which are essentially place holders for future modular expansion of the available memory. For example, at some future stage the user may wish to replace continuity memory modules 204a–b with additional memory modules. Hence, there is a need for an improved clock routing scheme.

Figure 17A:
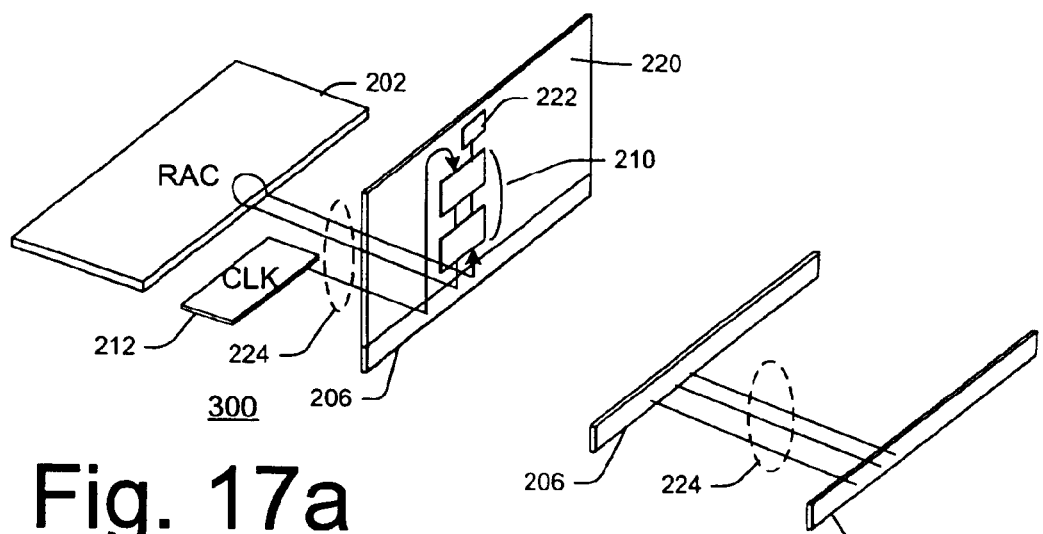
FIGS. 17A–B illustrate unknown an improved clock routing scheme, in accordance with certain implementations of the present invention.
Figure 17B:
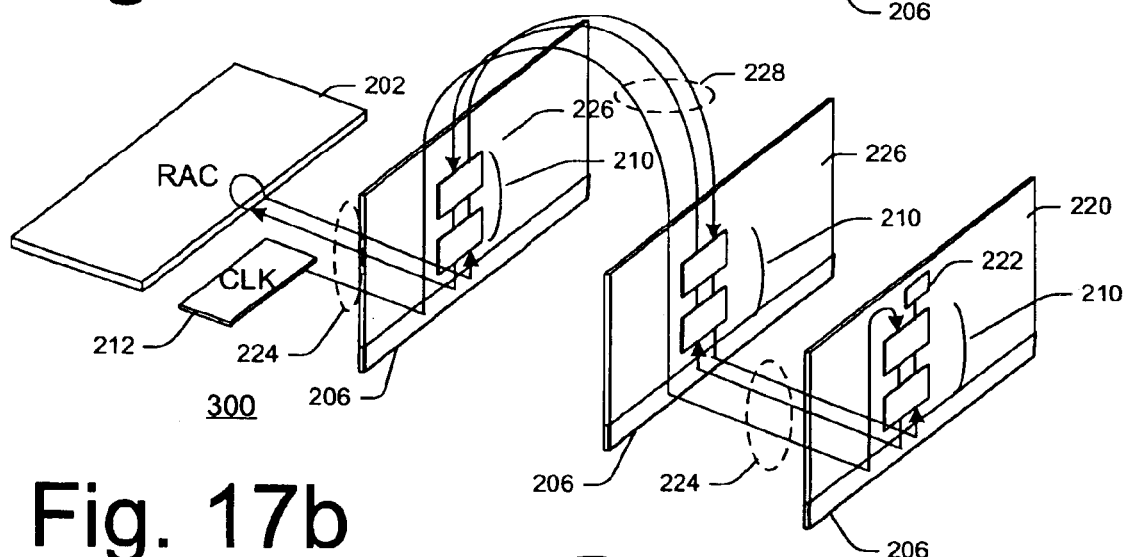

With this in mind, reference is now made to FIGS. 17a–b, wherein a new clock routing scheme is provided, which advantageously allows an improved "terminating" memory module 220 to be placed in different locations depending upon the users needs. For example, as depicted in FIG. 17a, clock generator 212 has been moved closer to RAC 202 on PCB 300 and configured to provide the clock signal to a first positioned module, and in this case terminating memory module 220. On terminating memory module 220 the clock signal is passed through memory integrated circuits 210 and back through tracings 224 to RAC 202. In this example, the clock signal is returned from RAC 202 to terminating memory module 220 through tracings 224 and passed one again through memory integrated circuits 210 to a terminator circuit 222. By locating terminator circuit 222 on terminating memory module 220 and rearranging the location of clock generator 212, terminating memory module 220 can be placed, in this example, in either the first slot as in FIG. 17a, or in the third slot, as will be seen in FIG. 17b. When placed in the first slot, memory module 220 does not require any additional continuity or place holding modules to complete the clock loop. Therefore, there will be cost savings to the manufacturer and user.

Should a user wish to expand the amount of memory at some stage in the future, then, in this example, terminating memory module 220 can be moved to the third slot as depicted in FIG. 17b. Here, additional memory modules 226 having memory integrated circuits 210 thereon are positioned in the first and second slots and interconnected via flexible conductor portion 228. Now, the clock signal travels from clock generator 212 through traces 224 and connector 206 to the memory module 226 in the first slot. The clock signal is then provided through flexible conductor portion 228 to the memory module 226 in the second slot. Next, the clock signal passes through traces 224 between the connectors 206 in the second and third slots. Once the clock signal reaches terminating memory module 220 it is provided to the memory integrated circuit(s) 210 thereon, to begin the clock loop. As depicted, the clock signal is then routed back through memory modules 226 in the second and first slots, and more particularly through the respective memory integrated circuit(s) 210 thereon.

From memory module 226 in the first slot, the clock signal is routed through traces 224 to RAC 202, and then back again. The clock signal is then routed from memory module 226 in the first slot to memory module 226 in the second slot, again over the flexible conductor portion 228, passing through their respective memory integrated circuit(s) 210 on each memory module. The clock signal is then passed through traces 224 to memory module 220 in the third slot. The clock signal then passes through memory integrated circuit(s) 210 on terminating memory module 220, and finally to terminator circuit 222 thereon.

Those skilled in the art will further recognize that additional signals (e.g., control and/or data) can also be routed in the same manner, as is the clock signal in FIGS. 17a–b, using like traces, lines, connectors, etc. Furthermore, additional channels having clock signals can be routed likewise.

Figure 18:
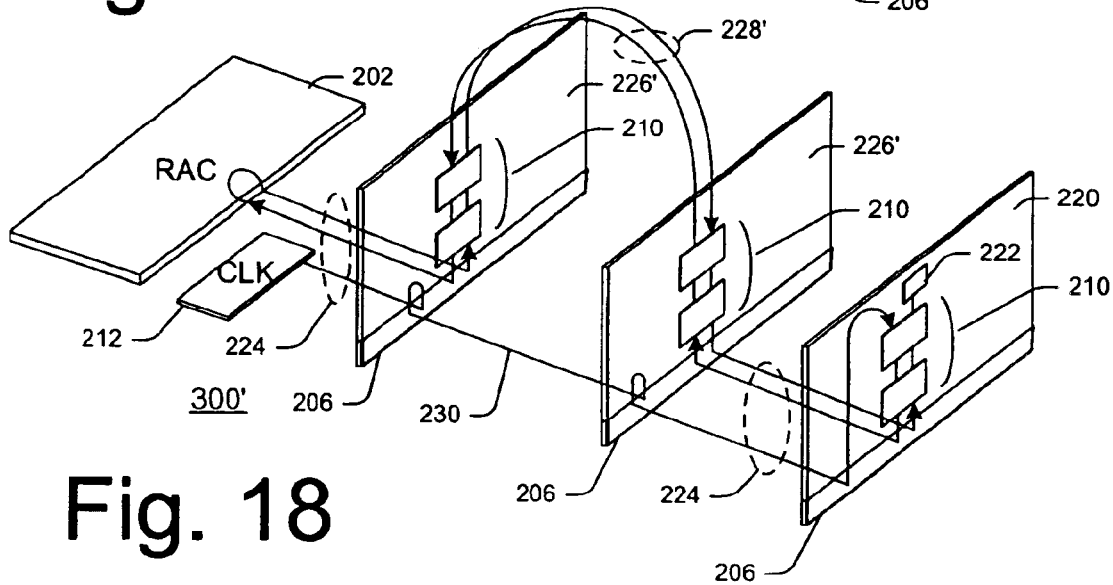
FIG. 18 illustrates another improved clock routing scheme, in accordance with certain further implementations of the present invention.

FIG. 18 depicts an alternative exemplary implementation of a PCB 300' in which memory modules 226' are configured to route the clock signal from clock generator 212 to terminating memory module 220 via trace 230 on PCB 300' rather than through a flexible conductor portion 228'. Such a configuration will alter the required number of traces/conductors/pins associated with flexible conductor portion 228' and connectors 206.

One of the main goals in the clock routing schemes depicted in the examples above is to provide a uniform transmission line without significant reflections, which could cause standing waves in the clock circuit. These exemplary arrangements support this goal by allowing the designer to reduce the number of discontinuities in the clock loop circuit.

Although some preferred implementations of the various methods and arrangements of the present invention have been illustrated in the accompanying Drawings and described in the foregoing Detailed Description, it will be understood that the invention is not limited to the exemplary implementations disclosed, but is capable of numerous rearrangements, modifications and substitutions without departing from the spirit of the invention as set forth and defined by the following claims.

What is claimed is:

1. An apparatus comprising:
   a memory interface circuit;
   a clock signal generating circuit;
   a plurality of memory modules, each having memory circuitry thereon, the memory modules being operatively coupled and arranged in an order, wherein the memory module positioned at the beginning of the order is coupled to an output of the clock signal generating circuit and the memory interface circuit, and the memory module positioned at the end of the order includes a clock signal terminating circuit, and
   wherein a clock loop is formed by initially directly routing a clock signal from the output of the clock signal generating circuit through each of the memory modules in the order to the memory module positioned at the end of the order without asserting the clock signal on the memory circuitry, then routing and asserting the clock signal back through the memory modules and the memory circuitry thereon in reverse order to the memory module positioned at the beginning of the order and from there to the memory interface circuit, then routing and asserting the clock signal from the memory interface circuit back through the memory modules and memory circuitry thereon in order to the memory module positioned at the end of the order, and then terminating the clock signal at the clock signal terminating circuit.

2. The apparatus as recited in claim 1, wherein the apparatus is provided as part of a computer.

3. An apparatus comprising:
   a circuit board;
   at least one clock generating circuit mounted on the circuit board;
   a first connector, a second connector and a third connector mounted on the circuit board
   a first conductor connecting an output node of the clock generating circuit with the first connector;
   a first non-terminating memory circuit card operatively arranged in the first connector and configured to receive a timing signal as output by the clock generating circuit and provided via the first conductor and first connector;
   a second non-terminating memory circuit card operatively arranged in the second connector
   a flexible conductor coupled between the first and second non-terminating memory circuit cards and configured to carry the timing signal from the first non-terminating memory card to the second non-terminating memory card;
   a second conductor connecting the second connector with the third connector;
   a terminating memory card operatively arranged in the third connector and configured to receive the timing signal from the second non-terminating memory circuit card via the second connector, the second conductors, and the third connector.

4. The apparatus as recited in claim 3, wherein the apparatus is provided as part of a computer.

5. An apparatus comprising:
   a circuit board;
   at least one clock generating circuit mounted on the circuit board;
   a first connector, a second connector and a third connector mounted on the circuit board
   a first conductor connecting an output node of the clock generating circuit with the first connector;
   a first non-terminating memory circuit card operatively arranged in the first connector and configured to receive a timing signal as output by the clock generating circuit and provided via the first conductor and first connector;
   a second conductor connecting the first connector with the second connector;
   a second non-terminating memory circuit card operatively arranged in the second connector and configured to receive the timing signal from the first non-terminating memory circuit card via the second conductor and second connector
   a third conductor connecting the second connector with the third connector;
   a terminating memory card operatively arranged in the third connector and configured to receive the timing signal from the second non-terminating memory circuit card via the second connector, the third conductor, and the third connector.

6. The apparatus as recited in claim 5, wherein the apparatus is provided as part of a computer.

7. A method for routing a clock signal in a device capable of supporting multiple memory modules, the method comprising:
   generating a clock signal;
   directly passing the clock signal to a terminating memory module;
   configuring the terminating memory module to provide the clock signal to at least one memory integrated circuit provided on the terminating memory module; then
   routing the clock signal from the terminating memory module to a memory interface circuit and then from the memory interface circuit back to the terminating memory module; and then
   terminating the clock signal at the terminating memory module.

8. A removable non-terminating module suitable for use with a system circuit board having at least one timing signal generating circuit and at least one memory interface circuit and configured to operatively couple to the removable non-terminating module, the removable non-terminating module comprising:
 a circuit board having a connector interface coupled to a plurality of conductive traces; the plurality of conductive traces including at least a first conductive trace, a second conductive trace, and a third conductive trace that are configurable to form different portions of a timing circuit, the timing circuit including a timing signal output by the at least one timing signal generating circuit; and
 at least one integrated circuit that includes memory circuitry mounted on the circuit board and operatively coupled to at least the second conductive trace and the third conductive trace;
 wherein the circuit board receives the timing signal in an unasserted condition via the first conductive trace and receives the timing signal in an asserted condition as part of a clock loop via the second conductive trace and the third conductive trace.

9. The memory device as recited in claim 8, wherein at least a portion of the plurality of conductive traces are configurable to carry data signals between the at least one integrated circuit and the connector interface.

10. The memory device as recited in claim 8, wherein the memory circuitry mounted on the circuit board includes dynamic random access memory (DRAM).

11. The memory device as recited in claim 8, wherein the system circuit board comprises at least one of a memory system circuit board or a computer system circuit board.

12. An arrangement comprising:
 a circuit board comprising:
  a memory interface circuit;
  a timing signal generating circuit that generates a timing signal;
  a first connector that is capable of receiving a memory circuit module; and
  a second connector that is capable of receiving a memory circuit module; and
 clock routing circuitry comprising:
  a first conducting path that couples the timing signal generating circuit to the first connector and the second connector; and
  a second conducting path that couples the memory interface circuit to the first connector and the second connector;
 wherein the arrangement is configured to propagate the timing signal in an unasserted condition via the first conducting path and to propagate the timing signal in an asserted condition as part of a clock loop via the second conducting path.

13. The arrangement as recited in claim 12, wherein the arrangement comprises at least one of a computer or a memory system.

14. The arrangement as recited in claim 12, wherein the first conducting path comprises at least one trace disposed on the circuit board between two adjacent connectors; and wherein the second conducting path comprises at least two traces disposed on the circuit board between the two adjacent connectors.

15. The arrangement as recited in claim 12, wherein the first conducting path comprises at least one wire that is part of a flexible conductor connecting two adjacent memory circuit modules; and wherein the second conducting path comprises at least two wires that are part of the flexible conductor connecting the two adjacent memory circuit modules.

16. The arrangement as recited in claim 12, wherein:
 the circuit board further comprises:
  a third connector that is capable of receiving a memory circuit module;
 wherein the first conducting path further couples the timing signal generating circuit to the third connector, and the second conducting path further couples the memory interface circuit to the third connector.

17. The arrangement as recited in claim 12, further comprising:
 a non-terminating memory circuit module located in the first connector, the non-terminating memory circuit module comprising:
  at least one memory integrated circuit; and
  a plurality of conducting traces, including a first conducting trace and a second conducting trace;
  wherein the first conducting trace and the second conducting trace extend the second conducting path from the first connector to the at least one memory integrated circuit.

18. The arrangement as recited in claim 12, further comprising:
 a terminating memory circuit module located in the first connector, the terminating memory circuit module comprising:
  at least one memory integrated circuit;
  a terminator circuit that is adapted to terminate the timing signal; and
  a plurality of conducting traces; the plurality of conducting traces including a first conducting trace, a second conducting trace, and a third conducting trace;
  wherein the first conducting trace and the second conducting trace extend the second conducting path from the first connector to the at least one memory integrated circuit; and wherein the third conducting trace extends the first conducting path from the first connector to the at least one memory integrated circuit.

19. The arrangement as recited in claim 18, wherein:
 the plurality of conducting traces of the terminating memory circuit module further include a fourth conducting trace that couples the at least one memory integrated circuit to the terminator circuit; and
 the fourth conducting trace extends the second conducting path to the terminator circuit, which terminates the clock loop of the second conducting path.

* * * * *